(12) United States Patent
Zhou

(10) Patent No.: US 10,404,371 B2
(45) Date of Patent: Sep. 3, 2019

(54) OPTO-ELECTRONIC OSCILLATOR WITH STIMULATED BRILLOUIN SCATTERING FEEDBACK

(71) Applicant: U.S. Army Research Laboratory ATTN: RDRL-LOC-I, Adelphi, MD (US)

(72) Inventor: Weimin Zhou, Rockville, MD (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 0 days.

(21) Appl. No.: 15/867,853

(22) Filed: Jan. 11, 2018

(65) Prior Publication Data

US 2018/0138978 A1 May 17, 2018

Related U.S. Application Data

(60) Provisional application No. 61/818,000, filed on May 1, 2013.

(51) Int. Cl.
| | |
|---|---|
| *H04B 10/04* | (2006.01) |
| *H04B 10/2537* | (2013.01) |
| *H04B 10/50* | (2013.01) |
| *H03B 17/00* | (2006.01) |
| *H03K 3/00* | (2006.01) |

(52) U.S. Cl.
CPC ......... *H04B 10/2537* (2013.01); *H03B 17/00* (2013.01); *H03K 3/00* (2013.01); *H04B 10/50577* (2013.01); *H04B 2210/006* (2013.01)

(58) Field of Classification Search
CPC ............ H01S 2301/03; H04B 10/2537; H04B 10/50577; H04B 10/50597; H04B 10/505; H04B 10/50593; H04B 10/588; H04B 10/2916; H04B 10/54; H04B 2210/006; H04B 10/58; H04B 10/5057; H04B 10/548; G06F 1/08; H03B 17/00; H03K 3/00
USPC ......... 398/116, 115, 79, 188, 141, 154, 158, 398/160, 161, 162, 192, 195, 198, 163
See application file for complete search history.

(56) References Cited

U.S. PATENT DOCUMENTS

| | | | | |
|---|---|---|---|---|
| 5,166,509 | A * | 11/1992 | Curran | H04B 10/5051 250/205 |
| 5,917,179 | A * | 6/1999 | Yao | H01S 3/302 250/205 |
| 6,476,959 | B2 * | 11/2002 | Yao | H01S 3/302 359/334 |
| 6,873,631 | B2 * | 3/2005 | Yao | H01S 5/0683 372/18 |
| 7,146,110 | B2 * | 12/2006 | Frederiksen, Jr. | ........... H04B 10/2537 398/194 |

(Continued)

*Primary Examiner* — Hibret A Woldekidan
(74) *Attorney, Agent, or Firm* — Alan I. Kalb

(57) ABSTRACT

An architecture for an optoelectronic oscillator uses Stimulated Brillouin Scattering (SBS) to seed, filter and amplify the oscillation signal in an overlapped oscillator loop for both a RF modulated optical sideband and a SBS signal. By phase matching the RF modulated optical sideband generated by SBS with the SBS signal, the feedback will collapse the bandwidth of the SBS signal and in turn the bandwidth of the Brillouin frequency signal, which also serves as a filter to filter out multiple undesired OEO loop modes. The embodiments herein result in reduced phase noise and increased stability.

10 Claims, 2 Drawing Sheets

(56) References Cited

U.S. PATENT DOCUMENTS

| | | | | |
|---|---|---|---|---|
| 7,151,415 B1* | 12/2006 | Zhou | ............... | G02F 2/002 |
| | | | | 331/66 |
| 7,349,637 B1* | 3/2008 | Frederiksen, Jr. | ............... | |
| | | | | H04B 10/2537 |
| | | | | 398/193 |
| 8,861,567 B2* | 10/2014 | Li | ............... | G01R 23/17 |
| | | | | 375/136 |
| 9,097,790 B2* | 8/2015 | Zhou | ............... | G01S 7/282 |
| 9,197,032 B2* | 11/2015 | Qiu | ............... | H01S 3/1304 |
| 9,288,557 B2* | 3/2016 | Zhou | ............... | H04Q 11/0003 |
| 9,882,654 B1* | 1/2018 | Yap | ............... | H04B 10/00 |
| 2004/0264977 A1* | 12/2004 | Yap | ............... | G02F 2/02 |
| | | | | 398/161 |
| 2006/0188267 A1* | 8/2006 | Gavrilovic | ............... | H04B 10/2537 |
| | | | | 398/188 |
| 2012/0230679 A1* | 9/2012 | Hayashi | ............... | H04B 10/5051 |
| | | | | 398/28 |
| 2014/0204387 A1* | 7/2014 | Narayanan | ............... | G01C 19/721 |
| | | | | 356/461 |
| 2016/0109736 A1* | 4/2016 | Bahl | ............... | G02F 1/125 |
| | | | | 385/1 |
| 2017/0302048 A1* | 10/2017 | Li | ............... | H01S 3/094003 |

\* cited by examiner

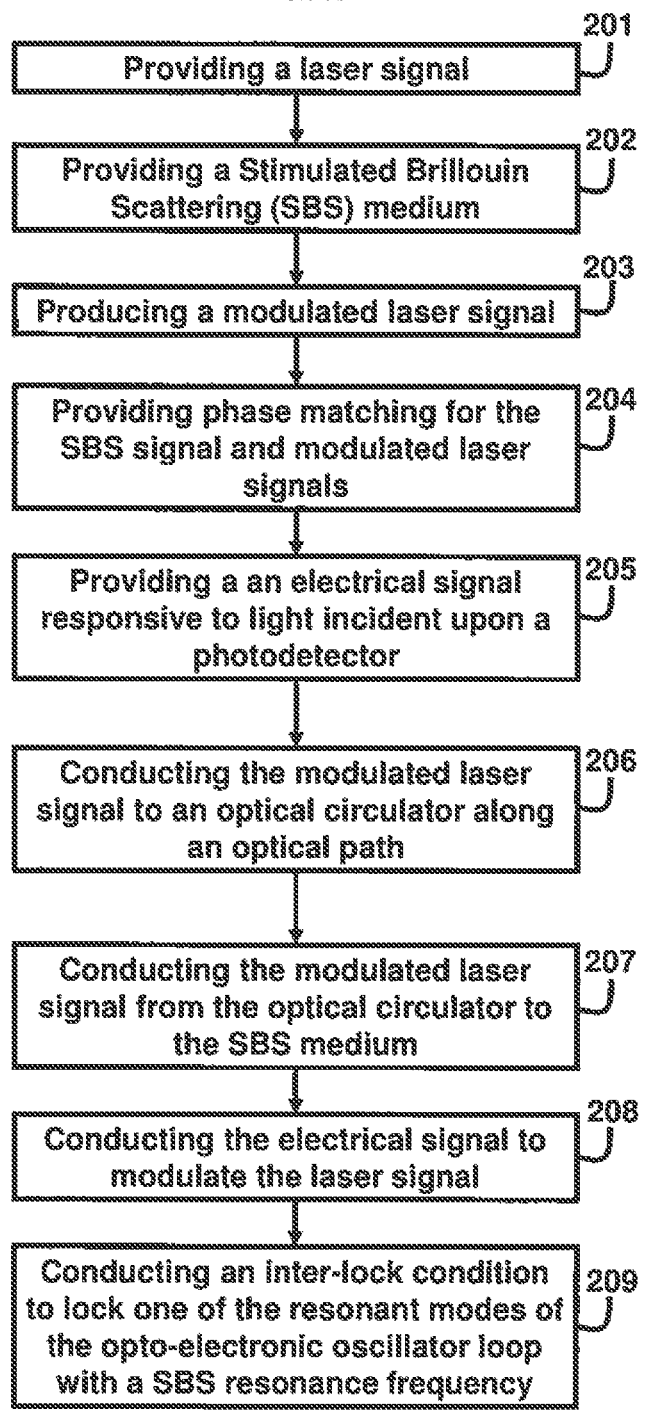

OPTO-ELECTRONIC OSCILLATOR WITH STIMULATED BRILLOUIN SCATTERING FEEDBACK

GOVERNMENT INTEREST

The embodiments described herein may be manufactured, used, and/or licensed by or for the United States Government without the payment of royalties thereon.

BACKGROUND

Technical Field

The embodiments herein generally relate to optoelectronic oscillators, and more particularly to an optoelectronic oscillator that employs stimulated Brillouin scattering.

Description of the Related Art

Oscillators are essential components in numerous electronic and optoelectronic devices and systems. In digital devices such as, for example, computers, oscillators provide the periodic signal as a digital clock used to generate a digital signal and synchronize and coordinate the switching functions that allow for the proper functioning of the digital circuitry within the computers. In telecommunication and radar systems, oscillators provide the periodic signal used to generate the carrier signal that is needed for transmitting and receiving information. Most commonly used oscillators are hybrid electronic oscillators that employ a resonator such as, for example, a quartz crystal. The hybrid electronic oscillators suffer from drawbacks such as being noisy and not operating reliably at higher frequencies.

To remedy these drawbacks optoelectronic oscillators have been proposed. An example of an optoelectronic oscillator can be seen in U.S. Pat. No. 5,917,179, issued to X. Steve Yao on Jun. 29, 1999, which is incorporated by reference herein in its entirety. However, such optoelectronic oscillators have not been entirely satisfactory.

SUMMARY

In view of the foregoing, an embodiment herein provides a method comprising providing a laser signal; providing a Stimulated Brillouin Scattering (SBS) medium; producing modulated laser signals; providing phase matching for the SBS signal and modulated laser signals; providing an electrical signal responsive to light incident upon a photodetector; conducting the modulated laser signal to an optical circulator along an optical path; conducting the modulated laser signal from the optical circulator to the SBS medium; conducting the electrical signal to modulate the laser signal to close an opto-electronic oscillator loop; and conducting an inter-lock condition to lock one of the resonant modes of the opto-electronic oscillator loop with a SBS resonance frequency.

The method may further comprise reflecting optical signals traveling along an optical path from the optical circulator through the SBS medium and to a reflector back along the same optical path back through the SBS medium and back to the optical circulator. The method may further comprise providing an optical subunit comprising the SBS medium, wherein an output of the optical subunit passes through the optical circulator and is directed by the optical circulator along an optical path from the optical circulator to the photodetector in order to conduct the output optical signal of the optical subunit to the photodetector.

The optical subunit may comprise a combined tunable time delay or optical phase shifter and reflector device, wherein the reflector is part of the combined tunable time delay and reflector device, wherein the modulated laser signal has at least one sideband having a frequency, wherein the laser modulated signal has at least one laser carrier signal having a laser frequency, wherein the laser carrier signal generates an SBS signal through stimulated Brillouin backscatter of the laser carrier signal as the laser carrier signal interacts with the SBS medium, and wherein the method further comprises tuning the optical subunit to phase match the sideband reflected by the reflector to the SBS signal in order to interlock one of the modes of the optoelectronic oscillator with the SBS resonance frequency.

The method may further comprise providing a difference in frequency between the laser carrier signal and the SBS signal, wherein the laser carrier signal and the SBS signal incident on the photodetector generate beats with a beat frequency in the RF range at the photodetector, the beat frequency corresponding to the difference in frequency between the laser carrier signal, modulation sideband signals and the SBS signal, and wherein the electrical signal from the photodetector includes a frequency in the RF range corresponding to the beat frequency between the laser carrier signal and the SBS signal.

The method may further comprise providing an electrical signal filter in an electrical signal path between the photodetector and the electrical input of the optical modulator in order to filter out frequencies other than the beat frequency between the laser carrier signal and the SBS signal so that the frequency of the modulating signal supplied to the electrical input of the optical modulator matches the beat frequency between the laser carrier signal and the SBS signal.

The method may further comprise providing an optical subunit comprising a combined tunable time delay or optical phase shifter and reflector device, wherein the reflector is part of the combined tunable time delay and reflector device, wherein the modulated laser signal has at least one sideband having a frequency, wherein the laser modulated signal has at least one laser carrier signal having a laser frequency, wherein the laser carrier signal generates an SBS signal through stimulated Brillouin backscatter of the laser carrier signal as the laser carrier signal interacts with the SBS medium, and wherein the method further comprises tuning the optical subunit to phase match the sideband reflected by the reflector to the SBS signal in order to interlock the oscillation mode of the optoelectronic oscillator with a SBS resonant frequency mode.

The method may further comprise providing a difference in frequency between the laser carrier signal and the SBS signal, wherein the laser carrier signal and the SBS signal incident on the photodetector generate beats with a beat frequency in the RF range at the photodetector, the beat frequency corresponding to the difference in frequency between the laser carrier signal and the SBS signal, and wherein the electrical signal from the photodetector includes a frequency in the RF range corresponding to the beat frequency between the laser carrier signal and the SBS signal. The method may further comprise providing an electrical signal filter in the electrical signal path between the photodetector and the electrical input of the optical modulator in order to filter out frequencies other than the beat frequency between the laser carrier signal and the SBS signal so that the frequency of the modulating signal supplied to the electrical input of the optical modulator matches the beat frequency between the laser carrier signal and the SBS signal. Phase matching the sideband of the modulated laser signal, that has been reflected by the reflector, with the SBS signal, results in a constructive resonant oscillation in the optoelectronic oscillator.

Another embodiment provides an optoelectronic oscillator system comprising a laser source for providing a laser signal; an optical modulator having at least one optical input, at least one optical output, and at least one electrical input, the laser source communicating with the optical input of the optical modulator via an optical communication path such that the laser signal passes through the optical modulator to produce a modulated laser signal; an optical subunit including a SBS medium, the optical subunit having an output optical signal; a photodetector that produces an electrical signal responsive to light incident upon the photodetector, and an optical circulator that optically communicates with the optical output of the optical modulator such that the modulated laser signal from the optical output of the modulator is conducted to the optical circulator along an optical path, wherein the optical circulator optically communicates with the SBS medium so that the modulated laser signal is conducted from the optical circulator to the SBS medium, wherein the photodetector optically communicates with the optical subunit so that the output optical signal of the optical subunit is communicated to the photodetector to generate a corresponding electrical signal, and wherein the photodetector electrically communicates with the optical modulator to allow the electrical signal from the photodetector to be communicated to the electrical input of the optical modulator to modulate the laser signal.

The optical subunit may further comprise a reflector that reflects optical signals traveling along an optical path from the optical circulator through the SBS medium and to the reflector back along the same optical path back through the SBS medium and back to the optical circulator to provide the output of the optical subunit to the optical circulator, and wherein the output of the optical subunit passes through the optical circulator and is directed by the optical circulator along an optical path from the optical circulator to the photodetector in order to communicate the output optical signal of the optical subunit to the photodetector.

The optical subunit may further comprise a combined tunable time delay or optical phase-shifter and reflector device, wherein the reflector is part of the combined tunable time delay and reflector device, wherein the modulated laser signal has at least one sideband having a frequency, wherein the laser modulated signal has at least one laser carrier signal having a laser frequency, wherein the laser carrier signal generates an SBS signal through stimulated Brillouin backscatter of the laser carrier signal as the laser carrier signal interacts with the SBS medium, and wherein the combined tunable time delay and reflector device allows tuning of the optical subunit to phase match the sideband reflected by the reflector to the SBS signal in order to lock the frequency of the optoelectronic oscillator with a SBS resonance frequency.

The system may further comprise a difference in frequency between the laser carrier signal and the SBS signal, wherein the laser carrier signal and the SBS signal incident on the photodetector generate beats with a beat frequency in the RF range at the photodetector, the beat frequency corresponding to the difference in frequency between the laser carrier signal and the SBS signal, and wherein the electrical signal from the photodetector includes a frequency in the RF range corresponding to the beat frequency between the laser carrier signal and the SBS signal. The system may further comprise an electrical signal filter in the electrical signal path between the photodetector and the electrical input of the optical modulator in order to filter out frequencies other than the beat frequency between the laser carrier signal and the SBS signal so that the frequency of the modulating signal supplied to the electrical input of the optical modulator matches the beat frequency between the laser carrier signal and the SBS signal.

Phase matching the sideband of the modulated laser signal, that has been reflected by the reflector, with the SBS signal, results in a constructive resonant oscillation in the optoelectronic oscillator. The system may further comprise an electrical signal phase shifter in the electrical signal path between the electrical signal filter and the electrical input of the optical modulator. The system may further comprise an electrical signal amplifier in the electrical signal path between the electrical signal phase shifter and the electrical input of the optical modulator. The system may further comprise an optical isolator in the optical path between the optical circulator and the photodetector, wherein the optical isolator allows light to pass through in one direction toward the photodetector and does not allow any light reflections or scattering from the photodetector to pass back toward the circulator to thereby reduce undesirable interference. The system may further comprise an optical amplifier in the optical communication path between the optical output of the optical modulator and the optical circulator.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 2 is a flow diagram illustrating a method, according to an embodiment herein.

DETAILED DESCRIPTION

Figure 1:
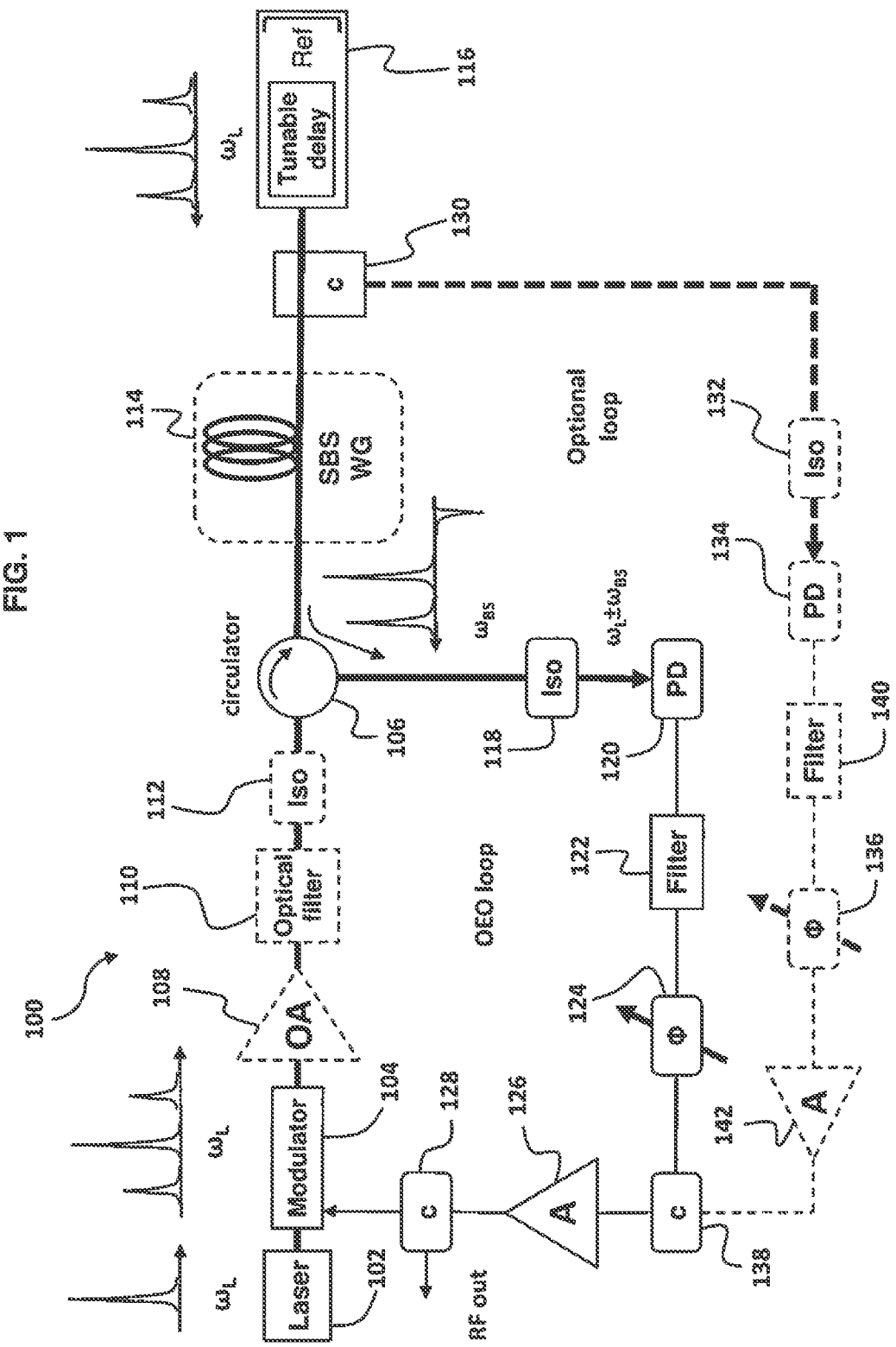
FIG. 1 is a schematic diagram illustrating a system, according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide an optoelectronic oscillator (OEO) that uses Stimulated Brillouin Scattering (SBS)

to seed, filter, and amplify the oscillation signal of the oscillator in overlapped oscillator loops for both the radio frequency (RF) modulated optical sideband and the SBS signal. Referring now to FIGS. 1 and 2, there are shown exemplary embodiments.

A SBS of a laser carrier is used to beat with the laser at a photodetector to generate a RF signal with a beat frequency $\Omega_B$ and then the beat frequency is used to modulate the laser carrier and thus complete a feedback loop. By matching the phase of the sideband of a reflected, modulated laser signal with the SBS scattering signal, a constructive resonant oscillation can occur. The SBS frequency is represented symbolically by $\omega_{BS}$. Brillouin shift frequency, Brillouin frequency, and beat frequency are used interchangeably herein to refer to $\Omega_B$. This process reiterates in a feedback loop system which may generate an optical frequency comb signal in the frequency domain with the frequency spacing being $\Omega_B$.

According to the embodiments herein, SBS is used not only to seed the RF signal oscillation in an optoelectronic oscillator loop, but also to form additional resonation loops that overlap the OEO loop. By placing the OEO signal in phase with the SBS signal, a self-filtered stable oscillation without spurious modes is created.

The oscillator of the embodiments herein may be used with any electronic system or RF electronic or communication system that would benefit from a precision oscillator. Examples of such systems include, without limitation, Radar, Signals Intelligence (SIGINT), Electronic Warfare (EW), Positioning, Navigation, and Timing (PNT), and other Command, Control, Communications, Computers, Intelligence, Surveillance, and Reconnaissance (C4ISR) systems. Additional exemplary applications for the optoelectronic oscillators of the embodiments herein include, without limitation, commercial high frequency RF systems and high bandwidth communication systems that need precision frequency synchronization. The oscillators according to the embodiments herein may also be used to provide integrated RF-photonic circuits with build in OEOs.

FIG. 1 illustrates a block diagram of a Brillouin Assisted Optoelectronic Oscillator (OEO) system 100, in accordance with the embodiments herein. A laser source 102 generating a laser of frequency $\omega_L$ is directed by an optical path to an optical modulator 104 such that the output of the laser source 102 is directed through the optical modulator 104. The optical modulator 104 has at least one optical input, at least one optical output, and at least one RF or electrical input that allows an electrical or electrical RF signal to be used for modulating the laser beam or laser signal passing through the optical modulator 104. The output of the optical modulator 104 is operatively connected to an optical circulator 106 such that the optical signal output from the optical modulator 104, which is the modulated laser signal in the illustrative example, may be directed to an input of the optical circulator 106. An optional optical amplifier 108 with an optical filter/isolator 110, 112 may be added between the optical modulator 104 and the input of the optical circulator 106, according to an example. The first output of the optical circulator 106 is operatively connected to a SBS generation waveguide (SBS-WG) 114, which generates, along the waveguide, backward propagating Brillouin scattered lights with frequency $\omega_{BS}$ that is lower than the laser frequency $\omega_L$ by the Brillouin frequency $\Omega_B$, where $\Omega_B = \omega_L - \omega_{BS}$.

SBS-WG may include any SBS medium capable of producing a sufficient; i.e., usable for an OEO application, Brillouin scattering effect in response to pumping by a laser of practicable power and beam width or linewidth. SBS-WG and SBS medium are used interchangeably herein. The SBS medium may include one SBS medium or a plurality of SBS media of the same type or of a plurality of types unless the SBS medium is more specifically identified. The SBS-WG 114 may, for example, be a standard single mode optical fiber or a chip scale dielectric optical waveguide that provides a sufficient Brillouin scattering effect when a laser signal of the appropriate power and beam width is guided through the SBS-WG. The SBS-WG may also be made by a micro-resonator that generate SBS signal when a pump laser is coupled into the micro-resonators whisper gallery mode.

For example, if the laser wavelength is 1.55 µm, the Brillouin frequency $\Omega_B$ in a single mode fiber will be about 10.8 GHz with a linewidth of about 30 MHz. However, under certain stimulated Brillouin scattering conditions, as described herein below, the linewidth may be made narrower.

The other end of the SBS-WG 114, which is the end farthest from the optical circulator 106, is operatively connected to a combined tunable time delay or optical phase shifter and reflector device 116. The tuning range of the delay is at least equivalent to a $2\pi$ phase shift of the laser light. An example is a fiber pigtailed optical phase modulator connected to a fiber end reflector or a Faraday mirror.

Both the laser light reflected by the phase-shifter/reflector 116 and the Brillouin scattered light are propagating back to the circulator 106 and are directed by the circulator to its second output which is operatively connected to another optical isolator 118 and a photodetector 120. The optical isolator 118 allows light to pass through in one direction toward the photodetector 120 and does not allow any light reflections or scattering from the direction of the photodetector 120 to pass back toward the optical circulator 106, which could cause undesirable interference. The laser light with frequency $\omega_L$ beats with SBS light $\omega_{BS}$, as well as higher order harmonics of SBS sidebands at the photodetector 120 to generate an RF signal of frequency $\Omega_B$ along with other RF frequencies. These RF signals are sent to a narrow band RF filter 122 to select an RF frequency $\omega_{RF}$ that is matched to $\Omega_B$. The filtered signal is sent to a RF phase shifter 124 for shifting the phase of the signal and then to an RF amplifier 126. Through a RF, 1×2 coupler 128 the RF signal is sent to the optical modulator 104, via the RF input of the optical modulator 104, to complete the OEO loop by modulating the laser signal with the RF frequency $\omega_{RF}$ such that the modulated laser signal will have at least one sideband with the frequency $\omega_{BS}$. The amplifier 126 is provided to ensure that the open loop gain of the OEO loop is greater than unity. The optical path through the SBS-WG and including the SBS-WG is at times referred to as an optical subunit of the OEO for ease of reference.

The modulated laser signal has two RF sidebands as well as its harmonics in the optical domain (except if a single-sideband modulator is used, then only the lower frequency sideband is present). In the context of the embodiments herein, by use of the term RF sideband it is meant that the sideband and the laser carrier have a beat frequency in the RF range. The frequency of the sideband is originally generated by the SBS frequency $\omega_{BS}$. Therefore, when these sideband signals are reflected by the phase-shifter-reflector 116, if the delay time or phase-shift is adjusted such that the sideband signal having frequency $\omega_{BS}$ is in phase with the SBS shifted backscatter signal having frequency $\omega_{BS}$, resulting from the stimulated Brillouin backscatter of the laser carrier signal of frequency $\omega_L$, the delayed and reflected sideband signal having frequency was will reinforce that SBS shifted backscatter signal. This feedback process may also collapse the linewidth of the Brillouin frequency ($\Omega_B$) signal.

The OEO loop may support many natural frequency modes; the longer the loop delay, the smaller the mode spacing will be. The main OEO loop's length is the optical path from the optical modulator 104 to the optical circulator 106, with the addition of the round trip optical path length from the optical circulator 106 to the reflector 116, with the addition of the length of the optical path from the optical circulator 106 to the photodetector (PD) 120, and with the addition of the electrical path from the PD 120 to the optical modulator 104. When the OEO feedback loop is completed, the oscillation frequency has to also match one of natural frequency modes of the loop cavity. If one selects a loop length/delay such that the mode spacing is in the order of the Brillouin frequency $\Omega_B$ linewidth, then the SBS sideband may also act as a filter to select a single mode from the oscillator loop. In that case, use of the tunable delay (phase-shifter)/reflector device 116 to adjust the reflected laser sideband's phase is used because there may not otherwise be a natural mode that may match the phase of the reflected sideband with that of the SBS backscattered signal of frequency $\omega_{BS}$, which is also referred to herein as the SBS signal.

There are many feedback loops that may be built using the backward SBS in this system 100. In addition, the reflected laser light may also generate SBS light propagation in a forward direction that may be reflected again to travel back to the photodetector 120. Furthermore, the laser light may also generate forward Brillouin scattering, which may also be reflected back by the delay-reflector device 116. Therefore, the system 100 may comprise of many overlapping resonating feedback loops. Each of the loops may have its own natural oscillator modes or frequencies. By adjusting the time delay and phase shift, only the modes that are in phase with the feedback SBS signal, which has a frequency $\omega_{BS}$, may be selected. Using the RF filter only one frequency mode may ultimately be selected. This will stabilize the oscillation mode and eliminate unwanted frequencies/spurs.

The laser originating from the laser source 102 has reasonable power and narrow linewidth to be able to generate SBS effectively. The optical modulator 104 may be a normal amplitude modulator, or a phase modulator, or even a single-sideband modulator. One may also add an optional feedback loop by tapping the optical signal at the end of the SBS-WG 114 farthest from the optical circulator 106, using the optical coupler 130, and send it to a second optical isolator 132 and photodetector 134. The output of the second photodetector 134 is then processed through another filter 140, RF phase shifter 136, and amplifier 142 combination. Then, the signal from the optional feedback loop may be combined with the signal from the first loop ii the RF domain via the second RF coupler 138.

FIG. 2, with reference to FIG. 1, is a flow diagram according to a method. Block 201 describes providing a laser signal (e.g., from laser source 102). Block 202 describes providing a Stimulated Brillouin Scattering (SBS) medium. Block 203 describes producing a modulated laser signal. Block 204 describes providing phase matching for the SBS signal and modulated laser signals. Block 205 describes providing an electrical signal responsive to light incident upon a photodetector 120. Block 206 describes conducting the modulated laser signal to an optical circulator 106 along an optical path. Block 207 describes conducting the modulated laser signal from the optical circulator 106 to the SBS medium. Block 208 describes conducting the electrical signal to modulate the laser signal to close an opto-electronic oscillator loop. Block 209 describes conducting an inter-lock condition to lock one of the resonant modes of the opto-electronic oscillator loop with a SBS resonance frequency.

In a further embodiment of the method, the modulated laser signal is conducted through the SBS medium to produce a SBS signal and then the modulated laser signal is operatively conducted to a reflector 116 to produce a reflected modulated laser signal. The SBS signal is operatively conducted to the optical circulator 106. The reflected modulated laser signal is passed back through the SBS medium and back to the optical circulator 106. The combined SBS signal and reflected modulated laser signal is operatively conducted to the photodetector 120 to produce the electrical signal for modulating the laser signal.

In another example of the method, a tunable delay or optical phase shifter may be provided in the optical pathway between the SBS medium and the reflector 116. As used herein, "conducting" or "operatively conducting" from component to another encompasses both direct and indirect conducting between the components unless one or the other is specified. It is contemplated that, in as yet other embodiments of the method, other components may be provided in the path or pathway between the two stated components unless specifically excluded.

The embodiments herein offer unique characteristics compared with existing OEO configurations. For example, compared with long fiber OEOs, the embodiments herein reduce the fiber length and eliminate the unwanted spurs. Compared with dual OEO configurations such as injection locked dual OEO or coupled Dual OEO, the embodiments herein simplify the system and use fewer components, thus reducing cost and size. Compared with coupled optoelectronic oscillators (COEOs), the OEO system 100 provides added stability. Compared with micro-resonator OEO, the embodiments herein reach the optimum operating state more easily and eliminate the technical difficulties of coupling the laser light to a desired Whisper Gallery Mode of a micro-resonator.

The previous Injection-locked OEO required two OEOs. One of the OEOs required a very long fiber, and the other OEO was required to provide a filter that was needed to reduce the spurs. The embodiments herein eliminate the need for the second OEO and the very long optical fiber.

There have been attempts to use SBS in OEOs such as shown in U.S. Pat. No. 5,917,179. However, the architecture used in the OEO systems of U.S. Pat. No. 5,917,179 does not employ a tunable delay reflector and phase shifter as used in the embodiments herein. OEOs such as those of U.S. Pat. No. 5,917,179 typically only work with a very long fiber loop and have too small a mode spacing to provide for matching a Brillouin mode. Therefore, the Brillouin bandwidth generally cannot act as a filter for selecting a single mode of the OEO, which may result in the OEOs of U.S. Pat. No. 5,917,179, having spurious modes.

The embodiments herein provides a unique OEO architecture (e.g., system 100) in which a modulated laser is used as pump laser to generate SBS, a tunable optical time-delay and reflector is used to match the phase of the modulated sideband with the SBS signal, and the narrow SBS linewidth or bandwidth, which may also be thought of as the narrow bandwidth of the Brillouin frequency signal, is used as a filter to filter out multiple modes other than the selected RF mode in the oscillation loop cavity.

The foregoing description of the specific embodiments will so fully reveal the general nature of the embodiments herein that others may, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein may be practiced with modification within the spirit and scope of the appended claims.

What is claimed is:

1. A method comprising:
providing a laser signal;
providing a Stimulated Brillouin Scattering (SBS) medium;
producing modulated laser signals;
providing phase matching for a SBS signal and modulated laser signals;
providing an electrical signal responsive to light incident upon a photodetector;
conducting the modulated laser signal to an optical circulator along an optical path;
conducting the modulated laser signal from the optical circulator to the SBS medium;
conducting the electrical signal to modulate the laser signal to close an opto-electronic oscillator loop; and
conducting an inter-lock condition to lock one of resonant modes of the opto-electronic oscillator loop with a SBS resonance frequency.

2. The method of claim 1, comprising reflecting optical signals traveling along an optical path from the optical circulator through the SBS medium and to a reflector back along the same optical path back through the SBS medium and back to the optical circulator.

3. The method of claim 2, comprising providing an optical subunit comprising the SBS medium, wherein an output of the optical subunit passes through the optical circulator and is directed by the optical circulator along an optical path from the optical circulator to the photodetector in order to conduct the output optical signal of the optical subunit to the photodetector.

4. The method of claim 3, wherein the optical subunit comprises a combined tunable time delay or optical phase shifter and reflector device, wherein the reflector is part of the combined tunable time delay and reflector device, wherein the modulated laser signal has at least one sideband having a frequency, wherein the laser modulated signal has at least one laser carrier signal having a laser frequency, wherein the laser carrier signal generates an SBS signal through stimulated Brillouin backscatter of the laser carrier signal as the laser carrier signal interacts with the SBS medium, and wherein the method further comprises tuning the optical subunit to phase match the sideband reflected by the reflector to the SBS signal in order to interlock one of the modes of the optoelectronic oscillator with the SBS resonance frequency.

5. The method of claim 4, comprising providing a difference in frequency between the laser carrier signal and the SBS signal, wherein the laser carrier signal and the SBS signal incident on the photodetector generate beats with a beat frequency in the RF range at the photodetector, the beat frequency corresponding to the difference in frequency between the laser carrier signal, modulation sideband signals and the SBS signal, and wherein the electrical signal from the photodetector includes a frequency in the RF range corresponding to the beat frequency between the laser carrier signal and the SBS signal.

6. The method of claim 5, comprising providing an electrical signal filter in an electrical signal path between the photodetector and the electrical input of the optical modulator in order to filter out frequencies other than the beat frequency between the laser carrier signal and the SBS signal so that the frequency of the modulating signal supplied to the electrical input of the optical modulator matches the beat frequency between the laser carrier signal and the SBS signal.

7. The method of claim 2, comprising providing an optical subunit comprising a combined tunable time delay or optical phase shifter and reflector device, wherein the reflector is part of the combined tunable time delay and reflector device, wherein the modulated laser signal has at least one sideband having a frequency, wherein the laser modulated signal has at least one laser carrier signal having a laser frequency, wherein the laser carrier signal generates an SBS signal through stimulated Brillouin backscatter of the laser carrier signal as the laser carrier signal interacts with the SBS medium, and wherein the method further comprises tuning the optical subunit to phase match the sideband reflected by the reflector to the SBS signal in order to interlock the oscillation mode of the optoelectronic oscillator with a SBS resonant frequency mode.

8. The method of claim 7, comprising providing a difference in frequency between the laser carrier signal and the SBS signal, wherein the laser carrier signal and the SBS signal incident on the photodetector generate beats with a beat frequency in the RF range at the photodetector, the beat frequency corresponding to the difference in frequency between the laser carrier signal and the SBS signal, and wherein the electrical signal from the photodetector includes a frequency in the RF range corresponding to the beat frequency between the laser carrier signal and the SBS signal.

9. The method of claim 8, comprising providing an electrical signal filter in the electrical signal path between the photodetector and the electrical input of the optical modulator in order to filter out frequencies other than the beat frequency between the laser carrier signal and the SBS signal so that the frequency of the modulating signal supplied to the electrical input of the optical modulator matches the beat frequency between the laser carrier signal and the SBS signal.

10. The method of claim 7, wherein phase matching the sideband of the modulated laser signal, that has been reflected by the reflector, with the SBS signal, results in a constructive resonant oscillation in the optoelectronic oscillator.

* * * * *